United States Patent
Liao et al.

(10) Patent No.: US 8,247,772 B2
(45) Date of Patent: Aug. 21, 2012

(54) INFRARED POSITIONING APPARATUS AND SYSTEM THEREOF

(75) Inventors: Tung Tsai Liao, Hsinchu (TW); Li Sheng Lo, Hsinchu (TW)

(73) Assignee: Generalplus Technology Inc., Hsinchu (TW)

( * ) Notice: Subject to any disclaimer, the term of this patent is extended or adjusted under 35 U.S.C. 154(b) by 312 days.

(21) Appl. No.: 12/698,300

(22) Filed: Feb. 2, 2010

(65) Prior Publication Data
US 2011/0079717 A1 Apr. 7, 2011

(30) Foreign Application Priority Data
Oct. 2, 2009 (TW) .............................. 98133499 A

(51) Int. Cl.
*G01J 5/20* (2006.01)
(52) U.S. Cl. .................................... 250/338.4
(58) Field of Classification Search ................ 250/338.4
See application file for complete search history.

(56) References Cited

U.S. PATENT DOCUMENTS

| 4,711,998 | A | * | 12/1987 | Malek | 250/206.1 |
| 5,818,617 | A | * | 10/1998 | Shipley | 398/54 |
| 6,323,487 | B1 | | 11/2001 | Wu | |
| 6,672,151 | B1 | * | 1/2004 | Schultz et al. | 73/146.5 |
| 2008/0018879 | A1 | * | 1/2008 | Kim et al. | 356/4.01 |
| 2009/0267919 | A1 | * | 10/2009 | Chao et al. | 345/175 |

FOREIGN PATENT DOCUMENTS

| TW | 200619595 | 6/2006 |
| TW | I294960 | 3/2008 |

OTHER PUBLICATIONS

Office Action for the corresponding Chinese counterpart application No. 201010246720.8, issued on May 17, 2012 cites US 4711998.
English translation for the corresponding Office Action for Chinese counterpart application No. 201010246720.8, issued on May 17, 2012.

* cited by examiner

*Primary Examiner* — David Porta
*Assistant Examiner* — Hugh H Maupin
(74) *Attorney, Agent, or Firm* — WPAT, P.C.; Anthony King

(57) ABSTRACT

An infrared positioning apparatus comprises a plurality of infrared diodes, a plurality of amplifying units, a plurality of converting units and a positioning unit. The plurality of infrared diodes is configured to detect at least one infrared signal. The plurality of amplifying units are configured to amplify the at least one infrared signal for obtaining at least one amplified signal. The plurality of converting units are configured to convert the at least one amplified signal for obtaining at least one strength value of the at least one amplified signal. The positioning unit is configured to obtain the emitting direction of the at least one infrared signal in accordance with the at least one strength value of the at least one amplified signal.

19 Claims, 5 Drawing Sheets

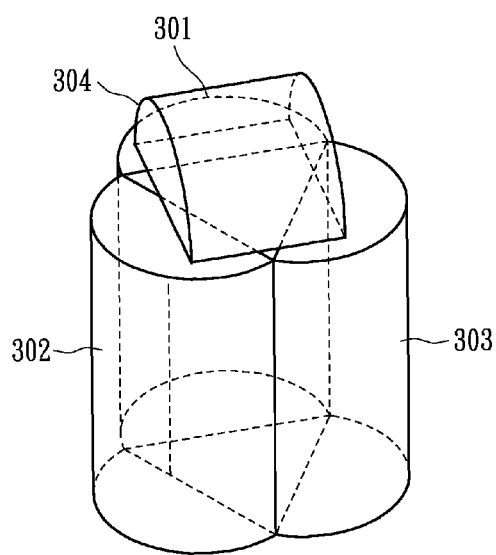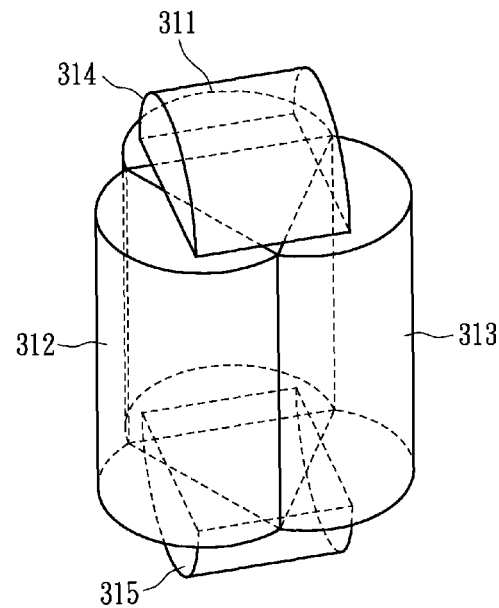
FIG. 3A
FIG. 3B

INFRARED POSITIONING APPARATUS AND SYSTEM THEREOF

BACKGROUND OF THE INVENTION

1. Field of the Invention

The present disclosure relates to a positioning apparatus and system thereof, and more particularly, to an infrared positioning apparatus and system thereof.

2. Description of the Related Art

TW Patent Publication No. 200619595 discloses a method and apparatus for positioning an infrared ray transmitter. The disclosure includes an image sensing set for positioning the infrared ray transmitter and outputting a control signal to control an apparatus. The infrared ray transmitter is positioned remotely from the image sensing set and transmits infrared rays. After receiving the infrared rays, the image sensing set calculates the position of the infrared ray transmitter and outputs the control signal. In addition, the image sensing set can be equipped inside the apparatus or can be arranged in a stand-alone manner.

TW Patent No. I294960 discloses a direction judgment system consisting of an image sensing module and a light source module. The light source module is remote from the image sensing module to be sensed as a spotlight. Therefore, the image sensing module can clarify the position of the spot within the surface representing the image sensing module. The direction of the light source can then be determined.

U.S. Pat. No. 6,323,487 discloses an IR optical position sensor system. The IR optical position sensor system comprises an infrared emitter and a receiver. The infrared emitter is utilized to emit infrared radiation toward an object. The receiver is utilized to receive the infrared radiation scattered by the object and to determine position of the object, wherein the receiver includes a detector and an optical system having two and no more than two lenses.

In light of the above inventions, developing a method to determine source information of infrared radiation or infrared light beams has become an important issue for the related industries.

SUMMARY OF THE INVENTION

An infrared positioning apparatus and system thereof disclosed herein utilize a plurality of first infrared diodes for detecting infrared signals emitted by an infrared emitting diode. The infrared positioning apparatus obtains 2D information or 3D information regarding emitting directions of the infrared emitting diode in accordance with strength values and carrier signals of amplified signals of the infrared signals detected by the plurality of first infrared diodes.

One embodiment of the present disclosure discloses an infrared positioning apparatus comprising a plurality of first infrared diodes, a plurality of amplifying units, a plurality of converting units and a positioning unit. The plurality of first infrared diodes is configured to detect at least one infrared signal, wherein the plurality of first infrared diodes is arranged on a plane. The plurality of amplifying units is configured to amplify the at least one infrared signal for obtaining at least one amplified signal. The plurality of converting units is configured to convert the at least one amplified signal for obtaining at least one strength value. The positioning unit is configured to obtain an emitting direction of the at least one infrared signal in accordance with the at least one strength value of the at least one amplified signal.

Another embodiment of the invention discloses an infrared positioning apparatus comprising at least one infrared emitting diode, at least one light guide unit, a plurality of first infrared diodes, a plurality of amplifying units, a plurality of converting units and a positioning unit. The at least one infrared emitting diode is configured to emit at least one first infrared signal. The at least one light guide unit is configured to guide the at least one first infrared signal. The plurality of first infrared diodes is configured to detect a reflective signal of the at least one first infrared signal or to detect at least one second infrared signal, wherein the plurality of first infrared diodes is arranged on a plane and included angles of arranged directions for every two adjacent first infrared diodes are equal. The plurality of amplifying units is configured to amplify the reflective signal or the at least one second infrared signal, so as to obtain at least one amplified signal. The plurality of converting units is configured to convert the at least one amplified signal for obtaining at least one strength value. The positioning unit is configured to obtain a source direction of the reflective signal or of the at least one second infrared signal in accordance with the at least one strength value of the at least one amplified signal.

Another embodiment of the invention discloses an infrared positioning system comprising an infrared emitting diode and an infrared positioning apparatus. The infrared positioning apparatus comprises a plurality of first infrared diodes, a plurality of amplifying units, a plurality of converting units and a positioning unit. The plurality of first infrared diodes is configured to detect at least one infrared signal, wherein the plurality of first infrared diodes is arranged on a plane. The plurality of amplifying units is configured to amplify the at least one infrared signal for obtaining at least one amplified signal. The plurality of converting units is configured to convert the at least one amplified signal for obtaining at least one strength value. The positioning unit is configured to obtain an emitting direction of the at least one infrared signal in accordance with the at least one strength value of the at least one amplified signal.

The foregoing has outlined rather broadly the features of the present disclosure in order that the detailed description of the disclosure that follows may be better understood. Additional features and advantages of the disclosure will be described hereinafter, which form the subject of the claims of the invention. It should be appreciated by those skilled in the art that the conception and specific embodiment disclosed may be readily utilized as a basis for modifying or designing other structures or processes for carrying out the same purposes as those of the present disclosure. It should also be realized by those skilled in the art that such equivalent constructions do not depart from the spirit and scope of the invention as set forth in the appended claims.

BRIEF DESCRIPTION OF THE DRAWINGS

The accompanying drawings illustrate several embodiments of the invention and, together with the description, serve to explain the principles of the invention. Those skilled in the art will recognize that the particular embodiments illustrated in the drawings are merely exemplary, and are not intended to limit the scope of the present disclosure.

FIG. 3A shows an infrared positioning apparatus according to another exemplary embodiment of the present disclosure;

FIG. 3B shows an infrared positioning apparatus according to another exemplary embodiment of the present disclosure;

PREFERRED EMBODIMENT OF THE PRESENT DISCLOSURE

Figure 1A:
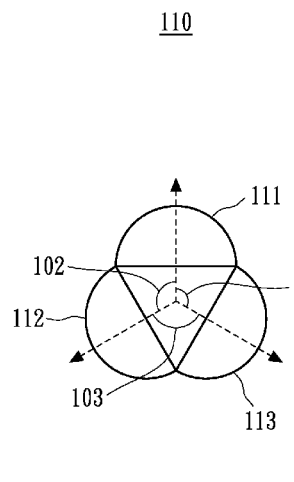
FIG. 1A shows a top view of an infrared positioning apparatus in accordance with an exemplary embodiment of the present disclosure.

FIG. 1A shows a top view of an infrared positioning apparatus 110 in accordance with an exemplary embodiment of the present disclosure. The infrared positioning apparatus 110 comprises infrared diodes 111-113 used for detecting infrared signals. The infrared diodes 111-113 are arranged on a plane. The included angles of arranged directions of every two adjacent infrared diodes are approximately 120 degrees. The horizontal detecting angles of the infrared diodes 111-113 are greater than 120 degrees.

Figure 1B:
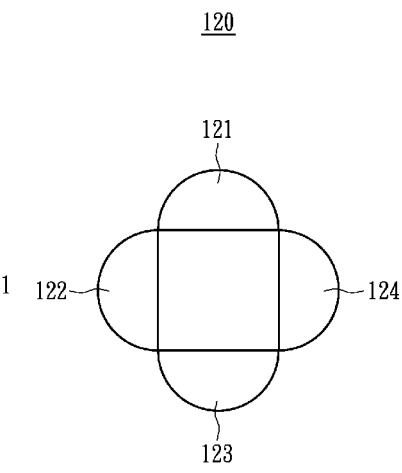
FIG. 1B shows a top view of an infrared positioning apparatus in accordance with another exemplary embodiment of the present disclosure.

FIG. 1B shows a top view of an infrared positioning apparatus 120 in accordance with another exemplary embodiment of the present disclosure. The infrared positioning apparatus 120 comprises infrared diodes 121-124 used for detecting infrared signals. The infrared diodes 121-124 are arranged on a plane. The included angles of arranged directions of every two adjacent infrared diodes are approximately 90 degrees. The horizontal detecting angles of the infrared diodes 121-124 are greater than 90 degrees.

Figure 1C:
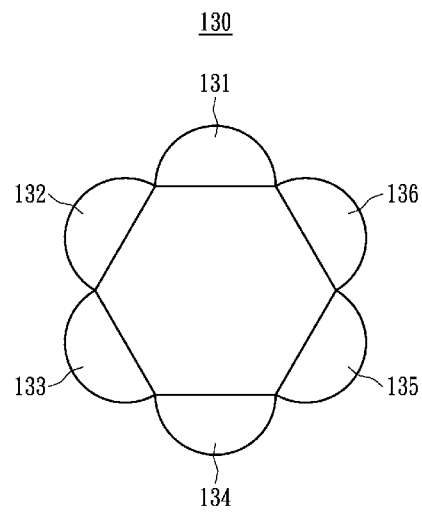
FIG. 1C shows a top view of an infrared positioning apparatus in accordance with another exemplary embodiment of the present disclosure.

FIG. 1C shows a top view of an infrared positioning apparatus 130 in accordance with another exemplary embodiment of the present disclosure. The infrared positioning apparatus 130 comprises infrared diodes 131-136 used for detecting infrared signals. The infrared diodes 131-136 are arranged on a plane. The included angles of arranged directions of every two adjacent infrared diodes are approximately 60 degrees. The horizontal detecting angles of the infrared diodes 131-136 are greater than 60 degrees.

The above-mentioned infrared positioning apparatuses 110, 120 and 130 are utilized for obtaining 2D information of an emitting direction of an infrared emitting source.

Figure 2:
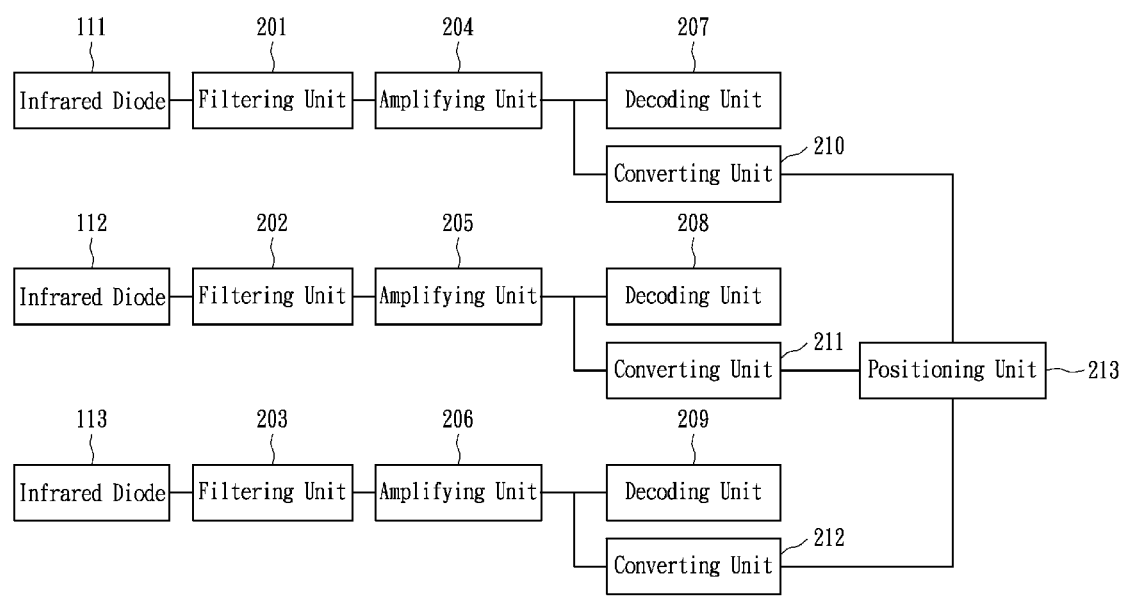
FIG. 2 shows a block diagram of an infrared positioning apparatus.

In accordance with an exemplary embodiment of the present disclosure, FIG. 2 shows a block diagram of the infrared positioning apparatus 110 comprising infrared diodes 111-113, filtering units 201-203, amplifying units 204-206, decoding units 207-209, converting units 210-212 and a positioning unit 213. The infrared diodes 111-113 are utilized to detect infrared signals. The filtering units 201-203 are utilized to obtain carrier signals of the infrared signals detected by the infrared diodes 111-113. A frequency-shift keying (FSK) scheme or an amplitude-shift keying (ASK) scheme is utilized for modulating the infrared signals detected by the infrared diodes 111-113. In this embodiment, signals with 50% duty cycle are used for encoding. However, the disclosure should not be limited to the embodiment. The amplifying units 204-206 are utilized to amplify the infrared signals for obtaining amplified signals of the infrared signals. The decoding units 207-209 are utilized to decode the carrier signals for obtaining command signals. The converting units 210-212 are utilized to convert the amplified signals for obtaining strength values of the amplified signals. In accordance with an exemplary embodiment of the present disclosure, each of the converting units 210-212 comprises a high-speed analog-to-digital converter or comprises a packet detector and an analog-to-digital converter. The positioning unit 213 is utilized to obtain source directions (emitting directions) of the infrared signals detected by the infrared diodes 111-113 in accordance with the strength values of the amplified signals.

FIG. 3A shows an infrared positioning apparatus 300 according to another exemplary embodiment of the present disclosure. The infrared positioning apparatus 300 comprises infrared diodes 301-304 used for detecting infrared signals. The infrared diodes 301-303 are arranged on a plane. The included angles of arranged directions of every two adjacent infrared diodes are approximately 120 degrees. The horizontal detecting angles of the infrared diodes 301-303 are greater than 120 degrees. In accordance with an exemplary embodiment of the present disclosure, the plane on which the infrared diode 304 is arranged is perpendicular to the plane on which the infrared diodes 301-303 are arranged. In other words, an arranged direction of the infrared diode 304 is perpendicular to arranged directions of the infrared diodes 301-303. Therefore, the 2D information (horizontal component information) of the emitting direction of an infrared emitting source can be obtained by the infrared diodes 301-303 of the infrared positioning apparatus 300. The vertical component information of the emitting direction of the infrared emitting source can be obtained by the infrared diode 304. According to the horizontal component information and the vertical component information, 3D information of the emitting direction of the infrared emitting source can be obtained.

FIG. 3B shows an infrared positioning apparatus 310 according to another exemplary embodiment of the present disclosure. The infrared positioning apparatus 310 comprises infrared diodes 311-315 used for detecting infrared signals. The infrared diodes 311-313 are arranged on a plane. The included angles of arranged directions of every two adjacent infrared diodes are approximately 120 degrees. The horizontal detecting angles of the infrared diodes 311-313 are greater than 120 degrees. The infrared diodes 314 and 315 are arranged on another plane. In accordance with an exemplary embodiment of the present disclosure, the plane on which the infrared diodes 314 and 315 are arranged is perpendicular to the plane on which the infrared diodes 311-313 are arranged. The 2D information (horizontal component information) of the emitting direction of an infrared emitting source can be obtained by the infrared diodes 311-313 of the infrared positioning apparatus 310. The vertical component information of the emitting direction of the infrared emitting source can be obtained by the infrared diodes 314 and 315. According to the horizontal component information and the vertical component information, 3D information of the emitting direction of the infrared emitting source can be obtained. Persons skilled in the art realize that the infrared positioning apparatus 300 or the infrared positioning apparatus 310 can be selected by a user depending on the environment in which the apparatus will be applied.

Figure 4A:
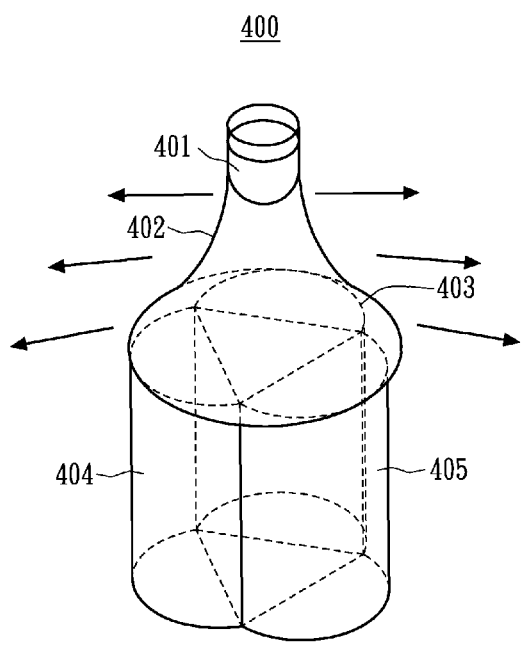
FIG. 4A shows an infrared positioning apparatus according to another exemplary embodiment of the present disclosure.

FIG. 4A shows an infrared positioning apparatus 400 according to another exemplary embodiment of the present disclosure. The infrared positioning apparatus 400 comprises an infrared emitting diode 401, a light guiding unit 402, infrared diodes 403-405, three filtering units (not shown), three amplifying units (not shown), three converting units (not shown), three decoding units (not shown) and a positioning unit (not shown). The infrared emitting diode 401 is utilized to emit at least one first infrared signal. The light guiding unit 402 is utilized to disperse the at least one first infrared signal. Persons skilled in the art realize that the guiding directions of the light guiding unit 402 vary due to its design and structure. The infrared diodes 403-405 are utilized to detect a reflective signal of the at least one first infrared signal or to detect at least one second infrared signal. The second infrared signal can be emitted by another infrared emitting diode (not shown). The infrared diodes 403-405 are arranged on a plane. The included angles of arranged directions of every two adjacent infrared diodes are approximately 120 degrees. The horizontal detecting angles of the infrared diodes 403-405 are greater than 120 degrees. The three filtering units are utilized to obtain at least one carrier signal of the at least one reflective signal or the at least one second infrared signal detected by the infrared diodes 403-405. A frequency-shift keying (FSK) scheme or an amplitude-shift keying (ASK) scheme can be selected for modulating the at least one first infrared signal and the at least one second infrared signal. In this embodiment, signals with 50% duty cycle are used for encoding. However, the disclosure should not be limited to the embodiment. The three amplifying units are utilized to amplify the reflective signal or the at least one second infrared signal, so as to obtain at least one amplified signal. The three decoding units are utilized to decode the at least one carrier signal for obtaining at least one command signal. The three converting units are utilized to convert the amplified signal for obtaining at least one strength value of the amplified signal. In accordance with an exemplary embodiment of the present disclosure, each of the converting units comprises a high-speed analog-to-digital converter or comprises a packet detector and an analog-to-digital converter. The positioning unit is utilized to obtain a source direction of the at least one reflective signal or the at least one second infrared diode in accordance with the at least one strength value.

Figure 4B:
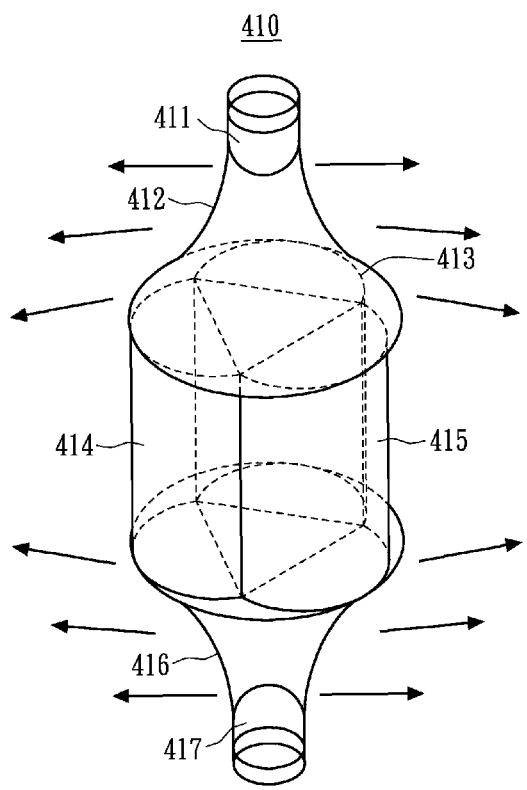
FIG. 4B shows an infrared positioning apparatus according to another exemplary embodiment of the present disclosure.

FIG. 4B shows an infrared positioning apparatus 410 according to another exemplary embodiment of the present disclosure. The infrared positioning apparatus 410 comprises infrared emitting diodes 411 and 417, light guiding units 412 and 416, infrared diodes 413-415, three filtering units (not shown), three amplifying units (not shown), three converting units (not shown), three decoding units (not shown) and a positioning unit (not shown). The infrared emitting diodes 411 and 417 are utilized to emit infrared signals. The light guiding units 412 and 416 are utilized to guide the infrared signals. Persons skilled in the art realize that the infrared positioning apparatus 400 or the infrared positioning apparatus 410 can be selected by a user depending on the environment in which the apparatus will be applied.

Figure 5:
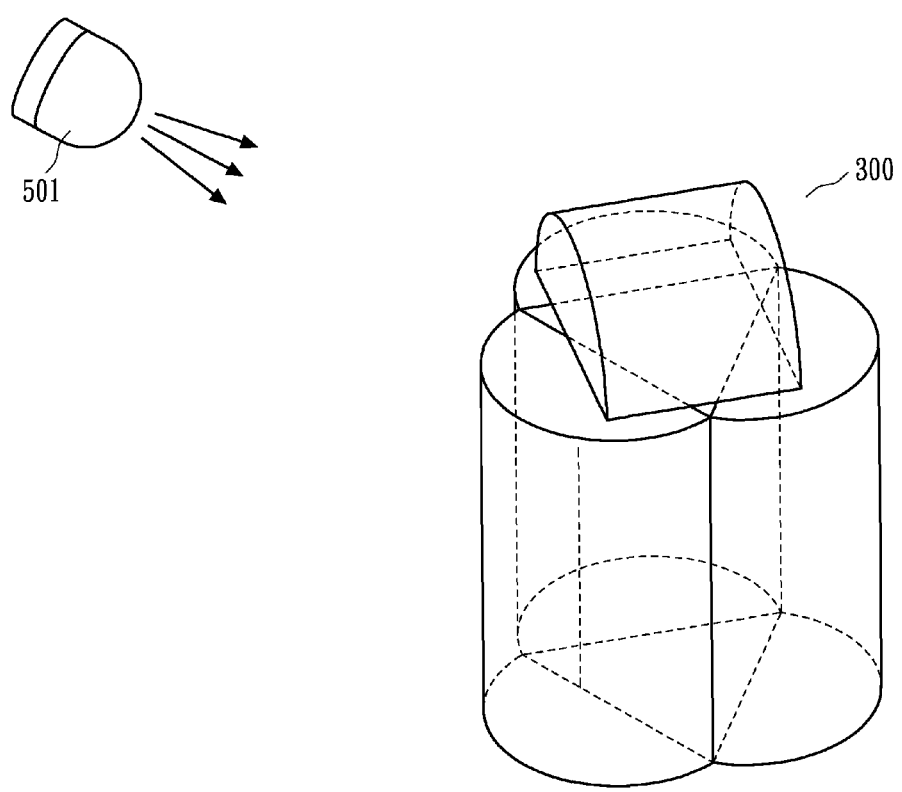
FIG. 5 shows an infrared positioning system according to another exemplary embodiment of the present disclosure.

FIG. 5 shows an infrared positioning system 500 according to another exemplary embodiment of the present disclosure. The infrared positioning system 500 comprises an infrared emitting diode 501 and an infrared positioning apparatus 300, wherein the infrared emitting diode 501 is utilized to emit infrared signals. The infrared positioning apparatus 300 determines a position of an infrared signal emitted by the infrared emitting diode 501 in accordance with a strength value and a carrier signal of the infrared signal, and obtains a command signal in accordance with the carrier signal of the infrared signal.

The shapes of the above-mentioned infrared emitting diodes and infrared diodes are not limited to the shapes disclosed in the embodiments of the present disclosure. Persons skilled in the art realize that the shapes of the infrared emitting diodes and the infrared diodes vary due to its design and structure. The above-described embodiments of the present disclosure are intended to be illustrative only. Numerous alternative embodiments may be devised by persons skilled in the art without departing from the scope of the following claims.

What is claimed is:

1. An infrared positioning apparatus comprising:
a plurality of first infrared diodes configured to detect at least one infrared signal, wherein the plurality of first infrared diodes is arranged on a plane;
a plurality of amplifying units configured to amplify the at least one infrared signal for obtaining at least one amplified signal;
a plurality of converting units configured to convert the at least one amplified signal for obtaining at least one strength value;
at least one second infrared diode configured to detect the at least one infrared signal, wherein an arranged direction of the second infrared diode is perpendicular to arranged directions of the plurality of first infrared diodes; and
a positioning unit configured to obtain an emitting direction of the at least one infrared signal in accordance with the at least one strength value.

2. The infrared positioning apparatus of claim 1, wherein horizontal detecting angles of the first infrared diodes are greater than included angles of arranged directions of every two adjacent first infrared diodes.

3. The infrared positioning apparatus of claim 1, wherein a frequency-shift keying (FSK) scheme or an amplitude-shift keying (ASK) scheme is utilized for modulating the at least one infrared signal.

4. The infrared positioning apparatus of claim 1, further comprising a plurality of filtering units configured to obtain at least one carrier signal of the at least one infrared signal.

5. The infrared positioning apparatus of claim 4, further comprising a decoding unit configured to decode the at least one carrier signal for obtaining at least one command signal.

6. The infrared positioning apparatus of claim 1, wherein each of the plurality of converting units comprises a high-speed analog-to-digital converter.

7. The infrared positioning apparatus of claim 1, wherein each of the plurality of converting units comprises a packet detector and an analog-to-digital converter.

8. The infrared positioning apparatus of claim 1, wherein the second infrared diode is arranged on the plurality of first infrared diodes or both on and beneath the plurality of first infrared diodes.

9. An infrared positioning apparatus comprising:
at least one infrared emitting diode configured to emit at least one first infrared signal;
at least one light guide unit configured to guide the at least one first infrared signal;
a plurality of first infrared diodes configured to detect a reflective signal of the at least one first infrared signal or to detect at least one second infrared signal, wherein the plurality of first infrared diodes is arranged on a plane and included angles of arranged directions for every two adjacent first infrared diodes are equal;
a plurality of amplifying units configured to amplify the reflective signal or the at least one second infrared signal, so as to obtain at least one amplified signal;
a plurality of converting units configured to convert the at least one amplified signal for obtaining at least one strength value; and
a positioning unit configured to obtain a source direction of the reflective signal or the at least one second infrared signal in accordance with the at least one strength value;

wherein the at least one infrared emitting diode is arranged on the plurality of first infrared diodes or both on and beneath the plurality of first infrared diodes.

10. The infrared positioning apparatus of claim 9, wherein horizontal detecting angles of the first infrared diodes are greater than included angles of arranged directions of every two adjacent first infrared diodes.

11. The infrared positioning apparatus of claim 9, wherein a frequency-shift keying (FSK) scheme or an amplitude-shift keying (ASK) scheme is utilized for modulating the at least one first infrared signal and the at least one second infrared signal.

12. The infrared positioning apparatus of claim 9, further comprising a plurality of filtering units configured to obtain at least one carrier signal of the at least one reflective signal or the at least one second infrared signal.

13. The infrared positioning apparatus of claim 12, further comprising a decoding unit configured to decode the at least one carrier signal for obtaining at least one command signal.

14. The infrared positioning apparatus of claim 9, wherein each of the plurality of converting units comprises a high-speed analog-to-digital converter.

15. The infrared positioning apparatus of claim 9, wherein each of the plurality of converting units comprises a packet detector and an analog-to-digital converter.

16. An infrared positioning system comprising an infrared emitting diode and an infrared positioning apparatus, wherein the infrared positioning apparatus comprises:
   a plurality of first infrared diodes configured to detect at least one infrared signal, wherein the plurality of first infrared diodes is arranged on a plane;
   a plurality of amplifying units configured to amplify the at least one infrared signal for obtaining at least one amplified signal;
   a plurality of converting units configured to convert the at least one amplified signal for obtaining at least one strength value;
   at least one second infrared diode configured to detect the at least one infrared signal, wherein an arranged direction of the second infrared diode is perpendicular to arranged directions of the plurality of first infrared diodes; and
   a positioning unit configured to obtain an emitting direction of the at least one infrared signal in accordance with the at least one strength value.

17. The infrared positioning system of claim 16, wherein horizontal detecting angles of the first infrared diodes are greater than included angles of arranged directions of every two adjacent first infrared diodes.

18. The infrared positioning system of claim 16, wherein a frequency-shift keying (FSK) scheme or an amplitude-shift keying (ASK) scheme is utilized for modulating the at least one infrared signal.

19. The infrared positioning system of claim 16, wherein the second infrared diode is arranged on the plurality of first infrared diodes or both on and beneath the plurality of first infrared diodes.

* * * * *